United States Patent [19]

Tews et al.

[11] Patent Number: 5,980,631
[45] Date of Patent: Nov. 9, 1999

[54] METHOD FOR MANUFACTURING III-V SEMICONDUCTOR LAYERS CONTAINING NITROGEN

[75] Inventors: Helmut Tews, Unterhaching; Meinrad Schienle; Robert Averbeck, both of Munich, all of Germany

[73] Assignee: Siemens Aktiengesellschaft, Munich, Germany

[21] Appl. No.: 08/992,182

[22] Filed: Dec. 17, 1997

[30] Foreign Application Priority Data

Dec. 17, 1996 [DE] Germany .................... 196 52 548

[51] Int. Cl.$^6$ ........................................ C30B 23/00
[52] U.S. Cl. ................ 117/89; 117/93; 117/108; 117/952
[58] Field of Search ....................... 117/9, 89, 93, 117/108, 952

[56] References Cited

U.S. PATENT DOCUMENTS 5,637,146  6/1997  Chyi ........................ 117/200
5,637,531  6/1997  Porowski et al. .............. 117/89

*Primary Examiner*—Benjamin Utech
*Assistant Examiner*—Kin-Chan Chen
*Attorney, Agent, or Firm*—Hill & Simpson

[57] ABSTRACT

A method for manufacturing III–V semiconductor layers containing nitrogen whereby during the growth of the layers, the setting of the material sources for Al, In and Ga remains fixed. During the transition to the growth of a layer with another mixed-crystal composition, the nitrogen flow is altered. A greater nitrogen flow leads to an increased installation of the more weakly bound group III elements into the growing material.

2 Claims, No Drawings

METHOD FOR MANUFACTURING III-V SEMICONDUCTOR LAYERS CONTAINING NITROGEN

BACKGROUND OF THE INVENTION

1. Field of the Invention

The present invention relates to a method for manufacturing abrupt boundary surfaces between ternary nitrides in molecular beam epitaxy.

2. Description of the Prior Art

The material system of the nitrides gallium nitride, indium nitride, aluminum nitride, and the ternary compounds thereof is very well-suited for the realization of optoelectronic components in the spectral region from red to ultraviolet. This is due to the possibility of a direct transition between the conduction band and the valence band (direct semiconductors). The high chemical and thermal resistance of such nitrides enables additional applications in sensor technology and high-temperature electronics as well.

A suitable method for the manufacture of the nitrides is molecular beam epitaxy. According to this method, binary, ternary or quaternary mixed-crystal compositions are deposited in an ultra-high vacuum from material flows of the elements present in the mixed-crystal compositions. For the manufacture of complex components, such as high-efficiency lasers and light-emitting diodes, for example, layer sequences of layers of different mixed-crystal compositions are required. The layers should be of as homogeneous a composition as possible, and the transitions between different compositions of the successive layers should ensue as abruptly as possible. Examples of this include multiple quantum well (MQW) structures in the active region of a laser (e.g., using InGaN) or superlattice structures as buffer layers (e.g., as an alternating sequence of thin layers of AlGaN and GaN). The manufacture of these layers requires an abrupt changeover of the material flows from the material sources for the elements Ga, Al and In in the transition from one layer (already grown) to the next layer (to be grown).

The changeover of the material flows (growth flows) has previously been enabled by one of two methods: interruption of the growth or doubling of the number of material sources. The interruption of the growth between the different layers allows the changeover of the material flows of the material sources, for the elements of group III of the periodic table, by changing the temperatures of the effusion cells of the epitaxy apparatus. A disadvantage of this method is that relatively long periods of time elapse before a source delivers a new stable material flow, which is required for the growth of the following layer. Moreover, the surface of the grown semiconductor layer changes during the interruption.

The other known possibility is to double the number of the material sources. One source then supplies the material flow needed at that moment while the other source is set to the material flow required for the following layer. However, in molecular beam epitaxial apparatuses, the maximum possible number of sources is very limited for geometrical reasons. As such, a doubling of effusion cells severely reduces the possibility of using these apparatuses.

SUMMARY OF THE INVENTION

The object of the present invention is to indicate a method for the epitaxial growth of III–V semiconductor layers containing nitrogen with various mixed-crystal compositions which can be carried out with a minimum number of material sources in an epitaxy apparatus and in which a continuous growth of different layers one after the other is possible.

This object is achieved in a method for epitaxial growth of at least two semiconductor layers having different mixed-crystal compositions of nitrogen and one or more elements from the group of aluminum, gallium and indium. The method comprising the steps of using an epitaxy apparatus for the epitaxial growth of the at least two semiconductor layers, and altering, during the epitaxial growth, the portion of nitrogen supplied per time unit during a transition from one grown layer to a next layer to be grown.

In an embodiment, the method further comprises the step of fixedly setting, during the epitaxial growth, the material sources for at least two elements from the group of aluminum, gallium and indium at such high material flows that all mixed crystal compositions provided for the semiconductor layers to be grown are produced solely with an alternation of the portion of nitrogen supplied per time unit.

In an embodiment, the method further comprises the step of providing beam epitaxy apparatus as the epitaxy apparatus, using the molecular beam epitaxy apparatus with a plasma source for atomic nitrogen, and altering the portion of nitrogen supplied per time unit by altering a flow of molecular nitrogen that is let into the plasma source.

Additional features and advantages of the present invention are described in, and will be apparent from, the detailed description of the presently preferred embodiments.

DETAILED DESCRIPTION OF THE PREFERRED EMBODIMENTS

In contrast to the arsenides or the phosphides, the material system of the nitrides enables growth conditions in which an excess of the group III elements (Ga, Al, In) is offered. At the standard growth temperatures, the excess material desorbs without the decomposition of the thermally-very-stable nitrides. If several elements of group III are thus offered simultaneously, of the overall excess of these elements, the elements that are most weakly bound are preferably desorbed. Accordingly, the elements that are bound more strongly in the mixed-crystal composition are preferably deposited. If a transition is made from group-III-rich growth conditions to nitrogen-rich growth conditions, the more weakly bound elements are also incorporated into the growing mixed-crystal composition. For this reason, when there is a constant offer of a material flow of the elements Al, Ga and In, the composition of the growing semiconductor layer can be influenced solely by variation of the nitrogen flow.

In the practical application of the method of the present invention, the material sources that supply the elements of group III (Al, Ga, In) are fixedly set. The material flows of these elements thus do not change, or change only as a result of a changed nitrogen flow. The material source that supplies the nitrogen is fixedly set during the growth of a determined semiconductor layer. When the layer is completely grown, the nitrogen flow is changed in such a way that the growth conditions for the subsequent layer to be grown are fulfilled. This changeover of the nitrogen flow can ensue very rapidly. The composition of the growing semiconductor material changes equally rapidly.

In standard molecular beam epitaxy apparatuses, a plasma source is present for the production of the atomic nitrogen required for the growth of the layers. The nitrogen flow can be changed easily and quickly by means of the flow of the molecular nitrogen flowing into the plasma cells. During the growth of the MQW or superlattice layer sequences, the amount of atomic nitrogen offered can be changed without difficulty at any time. Thus, it can be varied without interrupting the incorporation of the most weakly-bound III components (e.g., In in InGan). The method of the present invention thus enables, using conventional epitaxy equipment, the simple realization of abrupt, high-grade boundary surfaces between binary and ternary mixed-crystal compositions, or between ternary mixed-crystal compositions and other ternary mixed-crystal compositions, without interruption of the growth.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the hereafter appended claims.

We claim as our invention:

1. A method for epitaxial growth of at least two semiconductor layers having different mixed-crystal compositions of nitrogen and one or more elements from the group of aluminum, gallium and indium, the method comprising the steps of:

using a molecular beam epitaxy apparatus for the epitaxial growth of the at least two semiconductor layers;

fixedly setting, during the epitaxial growth, a material flow for at least two elements from the group consisting of aluminum, gallium and indium such that the mixed-crystal compositions of the at least two semiconductor layers are varied solely by alteration of a portion of nitrogen supplied per time unit; and altering, during the epitaxial growth, the portion of nitrogen supplied per time unit such that a non-continuous, rapid change of mass flow rate of nitrogen occurs during a transition from one grown layer to a next layer to be grown, wherein a first mixed crystal composition of the one grown layer is different than a second mixed crystal composition of the next layer to be grown.

2. The method as claimed in claim 1, further comprising the steps of:

using the molecular beam epitaxy apparatus with a plasma source for atomic nitrogen; and altering the portion of nitrogen supplied per time unit by altering a flow of molecular nitrogen that is let into the plasma source.

* * * * *